United States Patent
Lin et al.

(10) Patent No.: US 9,412,662 B2
(45) Date of Patent: Aug. 9, 2016

(54) STRUCTURE AND APPROACH TO PREVENT THIN WAFER CRACK

(71) Applicant: Taiwan Semiconductor Manufacturing Company, Ltd., Hsin-Chu (TW)

(72) Inventors: Shih Ting Lin, Taipei (TW); Jing-Cheng Lin, Hsin-Chu (TW); Szu-Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/579,396

(22) Filed: Dec. 22, 2014

(65) Prior Publication Data

US 2015/0214110 A1 Jul. 30, 2015

Related U.S. Application Data

(60) Provisional application No. 61/932,498, filed on Jan. 28, 2014.

(51) Int. Cl.
*H01L 27/148* (2006.01)
*H01L 21/78* (2006.01)
*H01L 21/56* (2006.01)
(Continued)

(52) U.S. Cl.
CPC .............. *H01L 21/78* (2013.01); *H01L 21/561* (2013.01); *H01L 23/3114* (2013.01); *H01L 24/97* (2013.01); *H01L 21/486* (2013.01); *H01L 23/147* (2013.01); *H01L 23/49816* (2013.01); *H01L 23/49827* (2013.01); *H01L 2224/16225* (2013.01); *H01L 2224/73204* (2013.01); *H01L 2924/0002* (2013.01); *H01L 2924/12042* (2013.01); *H01L 2924/15311* (2013.01); *H01L 2924/181* (2013.01); *H01L 2924/18161* (2013.01)

(58) Field of Classification Search
USPC .................... 257/777, 686, 678, E25.013, 99; 438/107, 109, 108, 126, 113, 15, 124
See application file for complete search history.

(56) References Cited

U.S. PATENT DOCUMENTS 7,843,042 B2   11/2010   Kuan et al.
8,643,148 B2   2/2014    Lin et al.
(Continued)

FOREIGN PATENT DOCUMENTS

CN   103000537 A    3/2013
KR   1020110105159  9/2011
(Continued)

*Primary Examiner* — Dao H Nguyen
*Assistant Examiner* — Tram H Nguyen
(74) *Attorney, Agent, or Firm* — Slater Matsil, LLP

(57) ABSTRACT

A semiconductor structure and a method of manufacture are provided. Devices, such as integrated circuit dies, are mounted on a substrate, such as another die, packaging substrate, interposer, or the like, and recesses are formed in the substrate along the scribe lines. One or more molding compound layers are formed in the recesses and between adjacent dies. A backside thinning process may be performed to expose the molding compound in the recesses. A singulation process is performed in the molding compound layer in the recesses. In an embodiment, a first molding compound layer is formed in the recess, and a second molding compound is formed over the first molding compound layer and between adjacent dies. The devices may be placed on the substrate before or after forming the recesses.

19 Claims, 13 Drawing Sheets

(51) Int. Cl.
*H01L 23/00* (2006.01)
*H01L 23/31* (2006.01)
*H01L 23/498* (2006.01)
*H01L 23/14* (2006.01)
*H01L 21/48* (2006.01)

(56) References Cited

U.S. PATENT DOCUMENTS

| | | | |
|---|---|---|---|
| 2012/0077314 A1 | 3/2012 | Park et al. | |
| 2012/0088332 A1* | 4/2012 | Lee | H01L 21/561 438/113 |
| 2012/0104624 A1* | 5/2012 | Choi | H01L 21/561 257/774 |
| 2012/0171814 A1* | 7/2012 | Choi | H01L 21/561 438/107 |
| 2012/0228749 A1* | 9/2012 | Pagaila | H01L 23/147 257/659 |
| 2012/0238057 A1 | 9/2012 | Hu et al. | |
| 2013/0175702 A1* | 7/2013 | Choi et al. | 257/774 |
| 2014/0264817 A1* | 9/2014 | Lee | H01L 25/0657 257/712 |

FOREIGN PATENT DOCUMENTS

| | | |
|---|---|---|
| KR | 1020120032254 | 4/2012 |
| TW | 200901411 A | 1/2009 |
| TW | 201015687 A | 4/2010 |
| TW | 201322406 A | 6/2013 |

* cited by examiner

STRUCTURE AND APPROACH TO PREVENT THIN WAFER CRACK

PRIORITY CLAIM AND CROSS-REFERENCE

This application claims priority to U.S. Provisional Application No. 61/932,498, filed on Jan. 28, 2014, and entitled "Structure And Approach To Prevent Thin Wafer Crack," which application is incorporated herein by reference.

BACKGROUND

In semiconductor device formation processes, device dies may be bonded to a wafer. Typically, after the bonding of the dies onto the wafer, a molding compound is applied to encapsulate the device dies and the wafer. After the molding compound is applied, a die saw is performed to saw the wafer and the device dies into packages, wherein each of the packages may include one of the device dies and one of the chips in the wafer. The die saw is typically performed using a blade, which cuts through the scribe lines in the wafer.

The wafer molding process during chip on wafer assembly may induce molding compound shrinkage and coefficient of thermal expansion (CTE) mismatch between, for example, a silicon substrate and the molding compound resulting in an unacceptable wafer level warpage. Wafer warpage may cause damage to through substrate vias (TSVs) and low-k dielectrics in the assembly. It is easy to have thin silicon cracks on the molded wafer due to stress induced during the formation process. It is also difficult to perform the die saw on the mixed material structure—that of the substrate and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
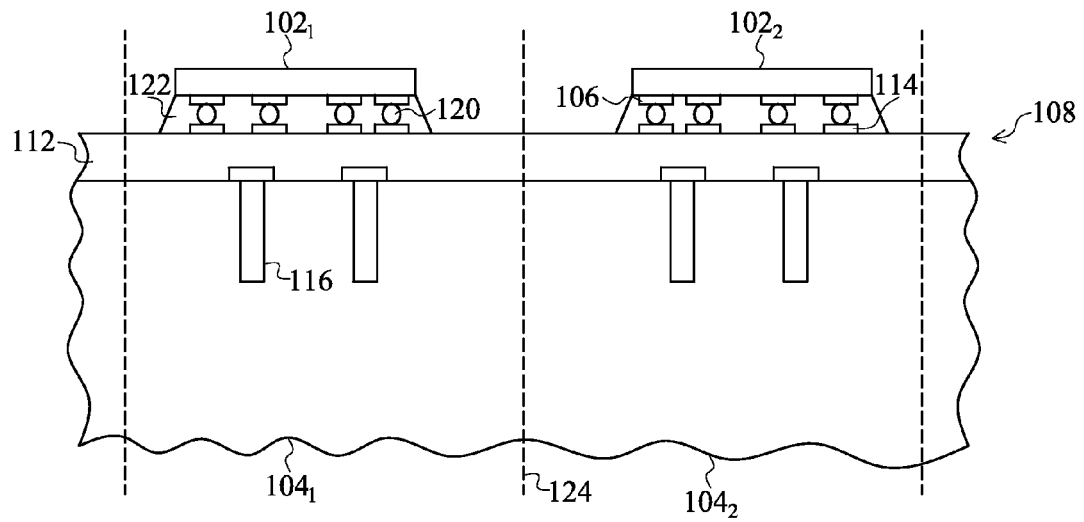
FIGS. 1-7 illustrate various intermediate stages of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein are described in a specific context, namely, dicing a chip on wafer (CoW) structure, thereby forming a three-dimensional integrated circuit (3DIC) package structure. For example, a plurality of dice is placed on a substrate, such as a processed wafer having integrated circuits formed thereon. The substrate is singulated to provide stacked integrated circuits, e.g., a 3DIC structure. These embodiments, however, are provided for illustrative purposes only and aspects of the current disclosure may be used in other embodiments. For example, embodiments such as those disclosed herein may be utilized with other types of substrates, such as packaging substrates, interposers, and the like. Furthermore, the processes described herein are simplified and illustrative only and do not limit the embodiments or the scope of the claims, and these examples are presented for explanation and understanding of the embodiments.

FIGS. 1-7 illustrate cross-sectional views of various intermediate stages in a fabrication of a semiconductor device in accordance with some embodiments. Referring first to FIG. 1, there is shown a plurality of first substrates $102_1$ and $102_2$ (collectively referred to as a first substrate 102) mounted on a second substrate 104. The first substrate 102 may represent one or more integrated circuit dies having electrical circuitry thereon. For example, the first substrate 102 may each comprise any suitable substrate, such as bulk silicon, doped or undoped, or a semiconductor-on-insulator (SOI) substrate, or the like. The electrical circuitry included on the first substrate 102 may be any type of circuitry suitable for a particular application. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include, for example, memory structures, processing structures, sensors, amplifiers, power distribution, input/output circuitry, or the like. The above examples are provided for illustrative purposes only to further explain applications of some illustrative embodiments and are not meant to limit the disclosure in any manner. Other circuitry may be used as appropriate for a given application. Furthermore, the first substrates 102 may contain similar or different circuitry.

The first substrate 102 further includes first electrical contacts 106 for providing an external electrical connection to the electrical circuitry formed thereon. One of ordinary skill in the art will appreciate that the first substrate 102 may include many other features. For example, the first substrate 102 may include various metallization layers/dielectric layers, vias, contacts, through-substrate vias, passivation layers, post-passivation interconnects, liners, adhesion/barrier layers, redistribution layers, under bump metallization layers, and/or the like. Any suitable process may be used to form the structures discussed above and will not be discussed in greater detail herein.

The second substrate 104 may comprise similar materials and/or devices as described for the first substrate 102, in some embodiments. For example, the second substrate 104 may comprise a processed wafer having a plurality of dies (indicated in FIG. 1 as dies $104_1$-$104_2$). FIG. 1 illustrates two dies $104_1$-$104_2$ separated by a scribe line 124 for illustrative purposes, and other embodiments may have any number of dies. In some embodiments, the first substrate 102 and the second substrate 104 represent dies having the same or different functionality. For example, in some embodiments, the first substrate 102 may be a memory die and the second substrate 104 may be a logic die. In other embodiments, the second substrate 104 may comprise other structures. For example, in some embodiments, the second substrate 104 may comprise an interposer, packaging substrate, or other type of substrate upon which the first substrate 102 is mounted, and may or may not include active semiconductor devices formed thereon.

In some embodiments, the second substrate 104 includes a redistribution layer 108 disposed proximate a top surface of the dies $104_1$-$104_2$. The redistribution layer 108 includes an insulating material 112 having conductive lines (not shown) and vias (not shown) disposed therein. Second electrical contacts 114 provide an electrical connection to electrical circuitry formed on the second substrate 104.

The second electrical contacts 114 may further provide electrical connections to through vias 116. Generally, the through vias 116 allows electrical connections to be made from one side of a substrate to another side of the substrate. For example, as discussed in greater detail below, the through vias 116 may provide an electrical connection between the first substrate 102 on a first side of the second substrate 104 to another substrate (not shown) that may be connected to the opposing side of the second substrate 104. The through vias may also provide an electrical connection between electrical circuitry formed on a first side of the second substrate 104 to devices connected to an opposing second side of the second substrate 104.

The first electrical contacts 106 on the first substrate 102 may be electrically coupled to the second electrical contacts 114 by electrical connections 120. The electrical connections 120 may be formed by any suitable method, such as direct metal-to-metal bonding, dielectric-to-dielectric bonding, hybrid bonding, or the like. In some embodiments, such as that illustrated in FIG. 1, the electrical connections 120 include metal bumps. The metal bumps may comprise solder and may comprise microbumps in some embodiments. The bumps may comprise other materials.

The first electrical contacts 106 and/or the second electrical contacts 114 may have various plating treatments to increase adhesion, provide diffusion barriers, prevent oxidation, and increase solderability, including nickel, gold, platinum, palladium, copper, and their alloys, and including such treatments as electroless nickel immersion gold ("ENIG"), electroless nickel electroless palladium immersion gold ("ENEPIG") and the like.

An optional underfill material 122 may be injected or otherwise formed in the space between the first substrate 102 and the second substrate 104. The underfill material 122 may, for example, comprise a liquid epoxy that is dispensed between the first substrate 102 and the second substrate 104, and then cured to harden. The underfill material 122 is used, among other things, to prevent cracks from being formed in the electrical connections 120, wherein cracks are typically caused by thermal stresses.

Alternatively, either a deformable gel or silicon rubber could be formed between the first substrate 102 and the second substrate 104 in order to help prevent cracks from occurring within the electrical connections 120. This gel or silicon rubber may be formed by injecting or otherwise placing the gel or rubber between the first substrate 102 and the second substrate 104. The deformable gel or silicon rubber can provide greater stress relief.

As will be explained in greater detail below, the second substrate 104, and the first substrates 102 attached thereto, will be encapsulated and singulated, thereby forming integrated circuit packages, such as a 3DIC package. Differences in the CTE between the various materials, such as the material of the molding compound and the material of the second substrate, may cause the second wafer to warp. The warping of the substrate in turn may damage components on the substrate, such as the through vias, the various layers on the substrate (e.g., low-k dielectric materials in the metallization layers), and the like. Warping may further cause the thinned substrates, such as a silicon substrate, to crack due to the stress caused by the warping.

Accordingly, as will be discussed in greater detail below, embodiments of the present disclosure provide a method of reducing the warping of the second substrate 104 during fabrication. For purposes of illustration, reference numeral 124 denotes scribe lines wherein the second substrate 104 is intended to be singulated. FIG. 1 illustrates an embodiment in which each package is to include a single first substrate 102. In other embodiments, a package may have two or more first substrates 102 mounted to a single substrate.

Figure 2:
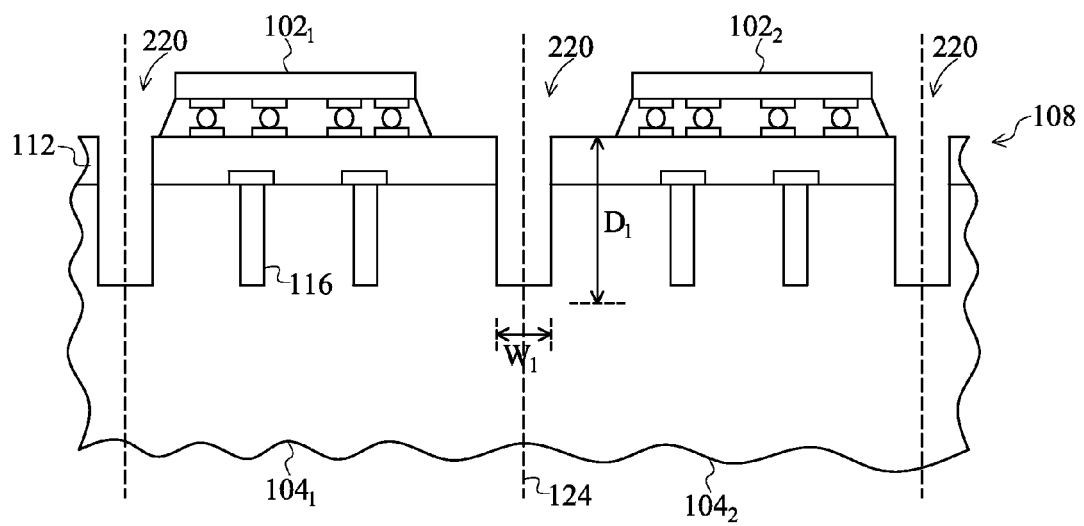

Referring now to FIG. 2, there is shown formation of recesses 220 along the scribe lines 124 in accordance with some embodiments. As discussed in greater detail below, a molding compound will be formed over the second substrate 104 and in the recesses 220. Forming the recesses 220 and placing molding compound within the recesses reduces the stress on the second substrate 104 and reduces the warping due to the CTE differences.

The recesses 220 may be formed using, for example, a saw, although other techniques may be used to create the recesses 220. For example, in other embodiments a laser, an etching process, or the like may be used to create the recesses 220.

In some embodiments, the recesses 220 extend through the metallization layers and into the underlying substrate, e.g., a silicon substrate. In an embodiment, the recesses 220 have a width W1 of about 1 µm to about 500 µm, and have a depth D1 of about 1 µm to about 800 µm.

Figure 3:
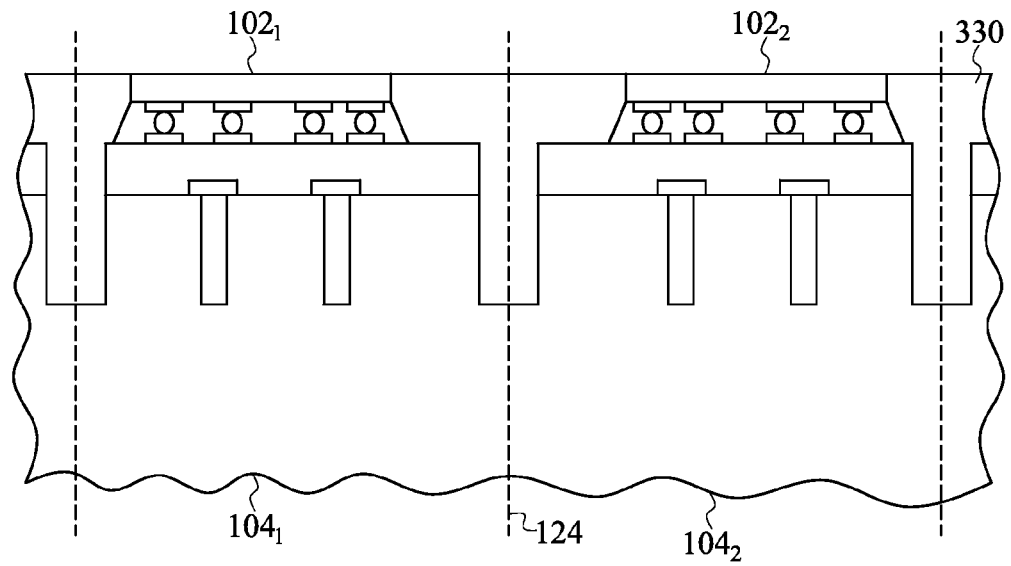

FIG. 3 illustrates a molding compound 330 formed over the first substrates 102 and in the recesses 220 (see FIG. 2) to protect the components from the environment and external contaminants, in accordance with some embodiments. The molding compound 330 may comprise compression molding and may comprise epoxy, rubber, or polyimide (PI) in some embodiments, for example, although the molding compound 330 may comprise other materials. In some embodiments, the molding compound 330 is a liquid or film type of material. The molding compound 330 fills the spaces between the first substrates 102 and fills the recesses 220.

After the molding compound 330 is cured, the molding compound 330 may be partially removed in a top grinding operation to expose the upper surfaces of the first substrates 102 as illustrated in FIG. 3. The upper surfaces of the first substrates 102 may be exposed, for example, to aid in heat dissipation. For example, in an embodiment, a heat sink or heat spreader may be attached to the upper surfaces of the first substrates 102 to aid in cooling the dice first substrates 102.

Figure 4A:
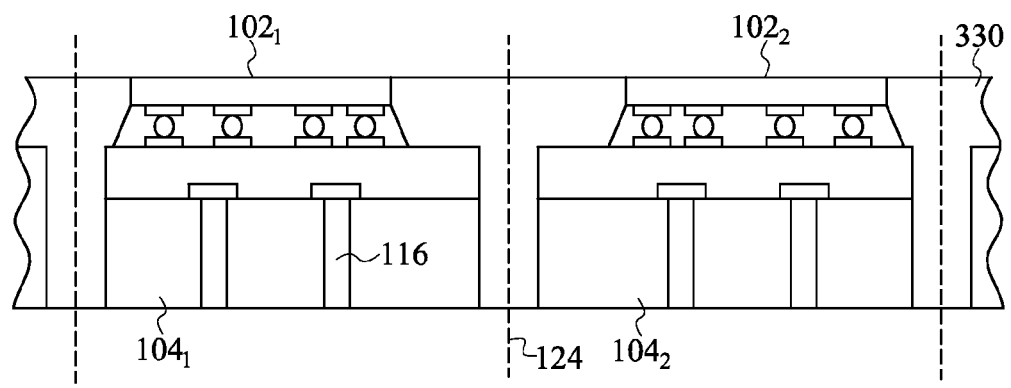
Figure 4B:
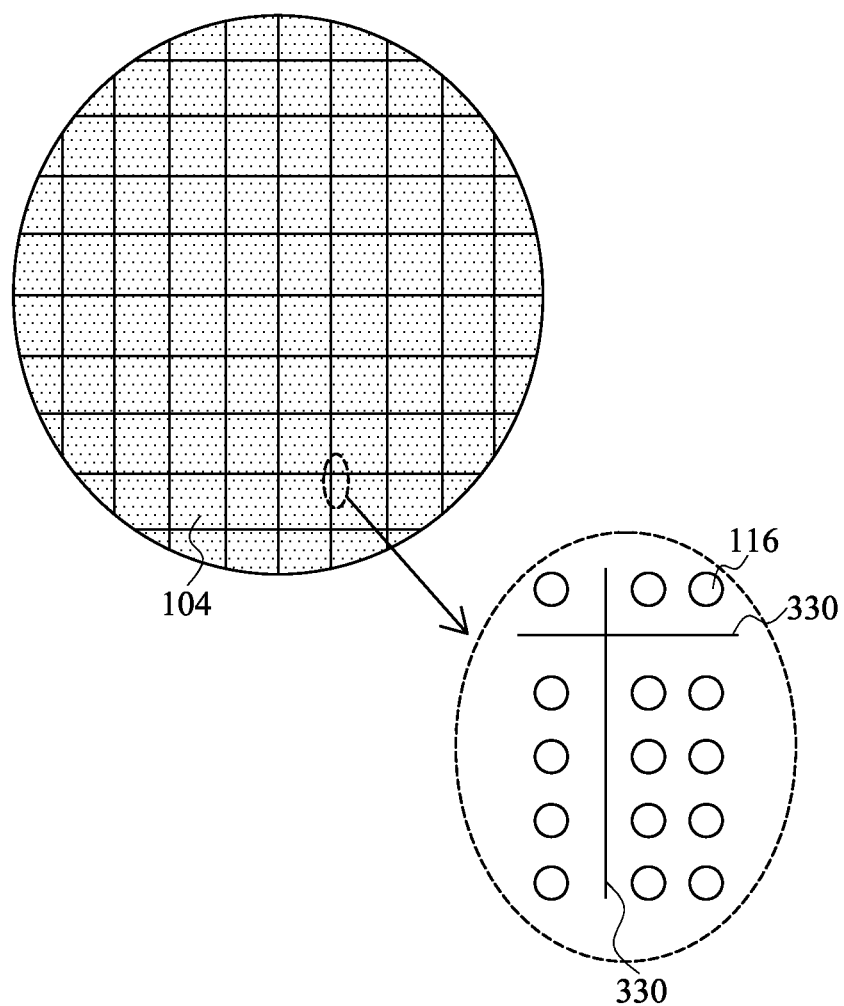

FIGS. 4A and 4B illustrate a backside thinning process that may be performed to expose the interconnect, e.g. the through vias 116, extending into the second substrate 104. The backside thinning is performed on a side opposing the first substrates 102. The thinning may be performed through physical grinding, chemical etching, combinations thereof, or the like, until the interconnect through vias 116 are exposed on the bottom surface of the second substrate 104, as shown in FIG. 4a. Following the backside thinning operation, the second substrate 104 may be thinned to a thickness, for example, between about 5 μm to about 500 μm.

As shown in FIG. 4B, which is a plan view of the backside of the second substrate 104 after the thinning process, in some embodiments the thinning process may be performed until the molding compound 330 in the recesses 220 is exposed.

Figure 5:
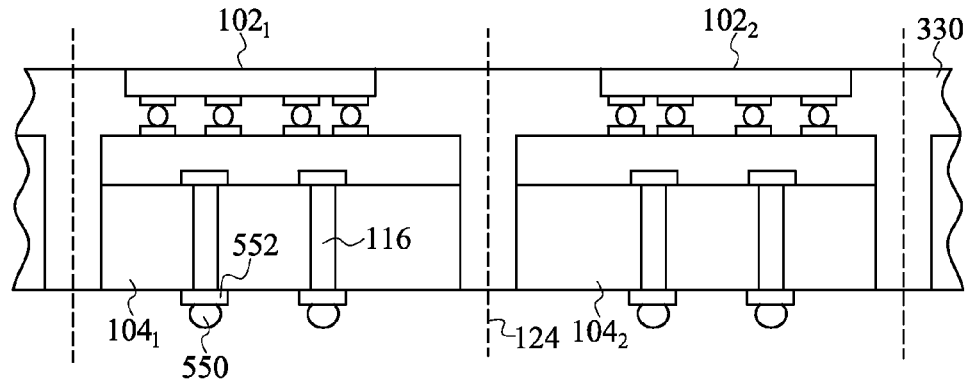

FIG. 5 illustrates electrical connections 550 formed along the backside of the second substrate 104 in accordance with some embodiments. In the embodiment illustrated in FIG. 5, the electrical connections 550 comprise bumping or solder balling formed over contact pads 552, although other types of electrical connections may be utilized. For example, C4 solder bumps or solder balls may be formed on the opposite or connection side of the second substrate 104 to form external or system connections when the second substrate 104 is mounted to a circuit board or card, wafer, packaging substrate, another interposer, or the like. The bottom surface of the second substrate 104 may have a redistribution layer ("RDL") forming connections that run horizontally and map the solder balls to different through vias 116, to provide flexibility in the solder ball placement. The solder may be a lead based, or lead free solder, and are compatible with solder reflow processes that will be used later to mount the interposer assemblies to a mother board, system board or the like in the target system. The contact pads 552 may have various plating treatments to increase adhesion, provide diffusion barriers, prevent oxidation, and increase solderability, including nickel, gold, platinum, palladium, copper, and their alloys, and including such treatments as electroless nickel immersion gold ("ENIG"), electroless nickel electroless palladium immersion gold ("ENEPIG") and the like.

Figure 6:
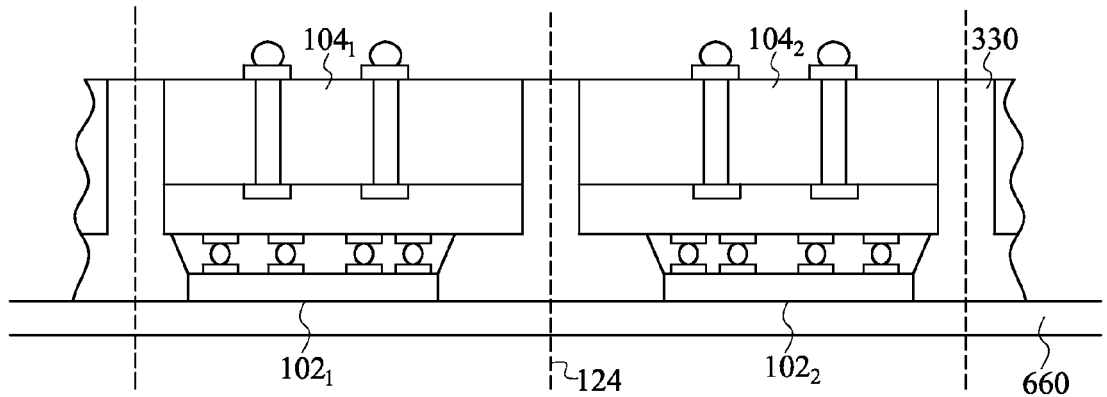

As illustrated in FIG. 6, the assembly is mounted on a carrier, such as a carrier or dicing tape 660, in accordance with some embodiments. In some embodiments, the carrier tape 660 has an adhesive surface that is used to attach to the molding compound 330 and the first substrates 102. Other types of carrier membranes may be used.

Figure 7:
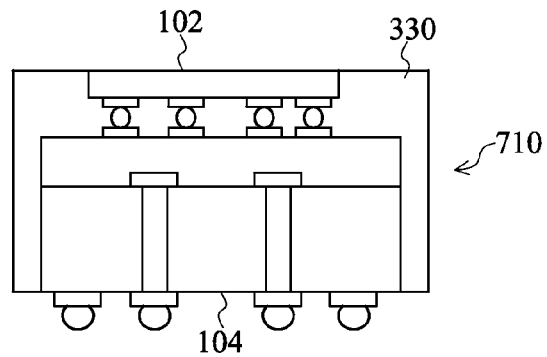

Thereafter, a singulation process may be performed to form separate packages, such as separate multi-die packages, as illustrated in FIG. 7. In some embodiments, the singulation process is performed by dicing through the molding compound 330. As discussed above, the molding compound 330 is exposed along the backside of the second substrate 104. During the singulation process, if the dicing process uses a width less than the width $W_1$ of the recess, then the singulation process can be performed through the molding compound 330 without the need to saw or dice through the second substrate 104 itself, reducing the risk of damaging the second substrate 104. In embodiments such as this, the molding compound 330 extends along sidewalls of the second substrate 104 after singulation, as indicated by reference numeral 710. The singulation process may be performed by sawing, lasing, etching, or the like.

Figure 8:
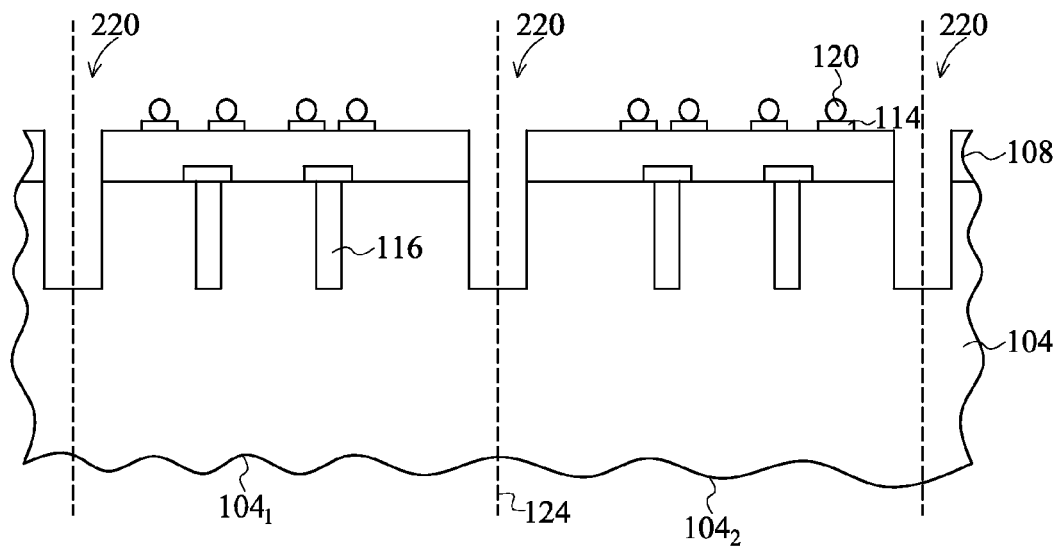
FIGS. 8 and 9 illustrate various intermediate stages of forming a semiconductor device in accordance with some embodiments.
Figure 9:
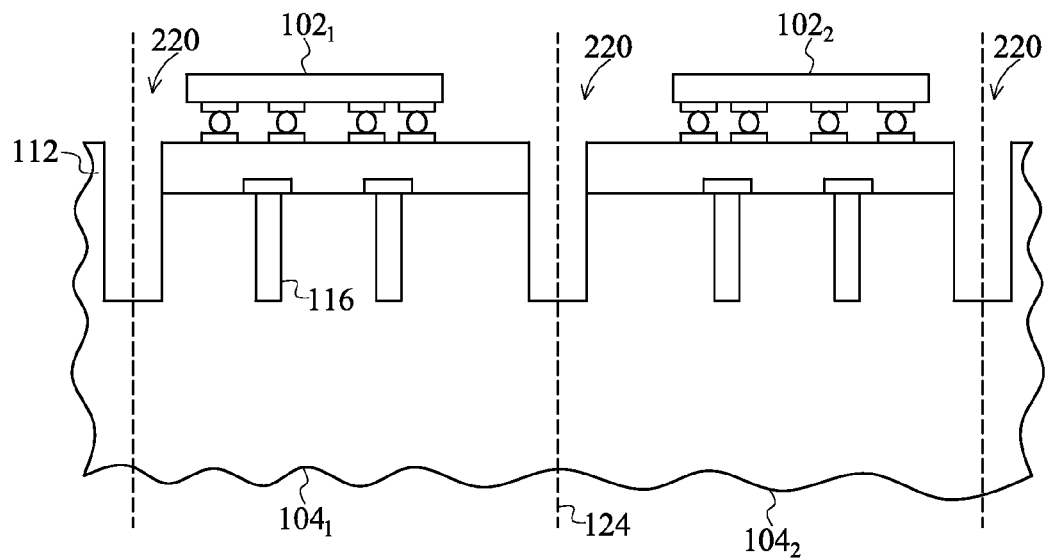

FIGS. 8 and 9 illustrate cross-sectional views of various intermediate stages in a fabrication of a semiconductor device in accordance with some embodiments. The various elements referred to in FIGS. 8 and 9 may refer to the same or similar elements as discussed above with reference to FIGS. 1-7, wherein like reference numerals refer to like elements.

Referring first to FIG. 8, there is shown the second substrate 104 prior to attaching the first substrates 102 in accordance with some embodiments. As illustrated in FIG. 8, the recesses 220 are formed in the second substrate 104 prior to attaching the first substrates 102 to the second substrate 104. The recesses 220 may have a similar shape and be formed in a similar manner as described above with reference to FIG. 2.

Referring now to FIG. 9, the first substrates 102 are attached to the second substrate 104 in accordance with some embodiments. Thereafter, the processes such as those described above with reference to FIGS. 3-7 may be performed to fabricate a multi-die package.

Figure 10:
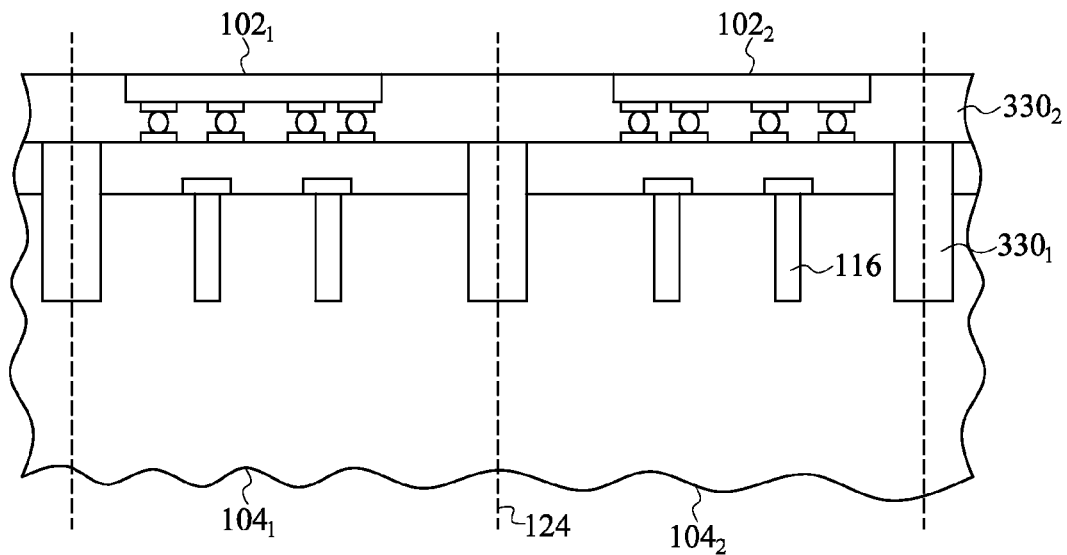
FIGS. 10 and 11 illustrate various intermediate stages of forming a semiconductor device in accordance with some embodiments.
Figure 11:
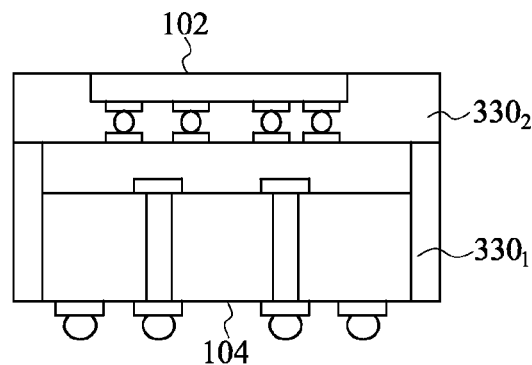

The embodiments discussed above with reference to FIGS. 1-9 illustrate the use of a single molding compound layer. In some embodiments, multiple molding compound layers may be utilized. For example, FIGS. 10 and 11 illustrate an embodiment in which two molding compound layers, e.g., a first molding compound layer $330_1$ and a second molding compound layer $330_2$, collectively referred to as molding compound layer 330, are utilized. In this example, the first molding compound layer $330_1$ is formed within the recesses 220 (see, e.g., FIG. 9), and the second molding compound layer $330_2$ is formed between adjacent ones of the first substrates 102. The first molding compound layer $330_1$ may be formed of similar materials using similar processes as discussed above with reference to FIG. 3. It is noted that with regard to the second embodiment discussed above with reference to FIGS. 8 and 9, the first molding compound layer $330_1$ may be formed prior to or after the attachment of the first substrate 102 to the second substrate 104. Thereafter, similar processes such as those discussed above with reference to FIGS. 4-7 may be performed.

FIG. 11 illustrates a resulting cross-sectional view after a singulation process has been performed. As illustrated, the first molding compound layer $330_1$ is formed along sidewalls of the second substrate 104, and the second molding compound layer $330_2$ is formed along sidewalls of the first substrate 102. The materials of the first molding compound layer $330_1$ and the second molding compound layer $330_2$ may be the same or different materials.

Figure 12:
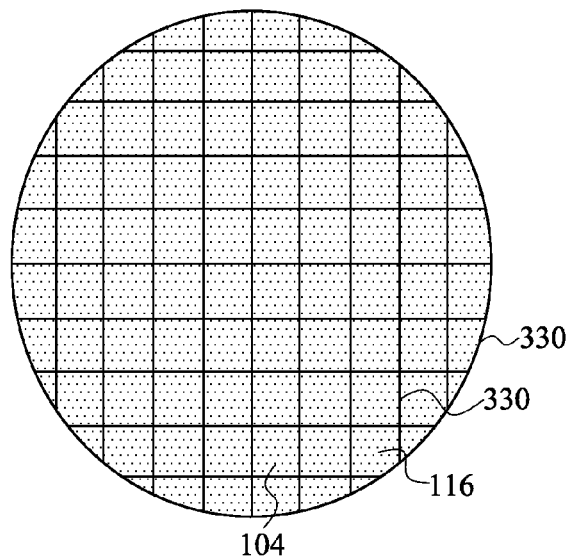
FIG. 12 is a plan view of a wafer prior to singulation in accordance with some embodiments.

FIG. 12 illustrates plan view of another embodiment, after processes such as those discussed above are performed. FIG. 4B referenced above illustrates a plan view of the backside of the second substrate 104, wherein the molding compound layer 330 is exposed along the scribe lines. In that embodiment, the molding compound layer 330 did not extend along the perimeter of the wafer.

FIG. 12 illustrates an embodiment in which the recess 220 extends along the periphery of the wafer and is filled with molding compound. In such an embodiment, the edges of the wafer may be protected by the molding compound layer 330 during processing, thereby preventing or reducing damage to the wafer, e.g., the second substrate 104.

Figure 13:
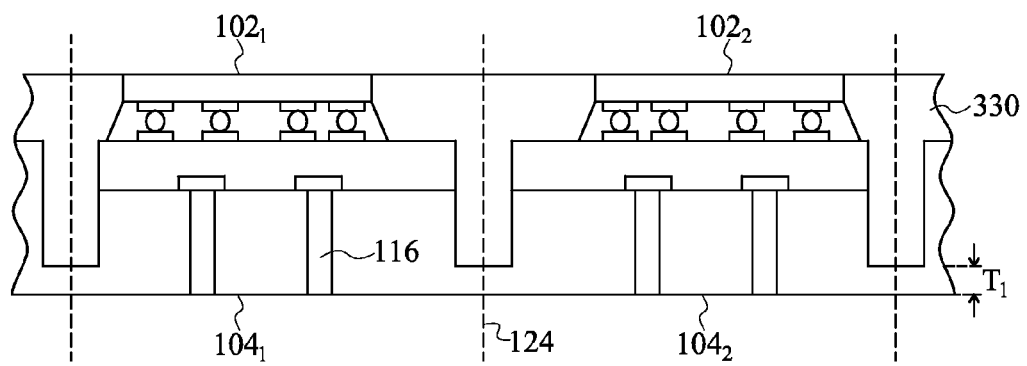
FIGS. 13 and 14 illustrate various intermediate stages of forming a semiconductor device in accordance with some embodiments.
Figure 14:
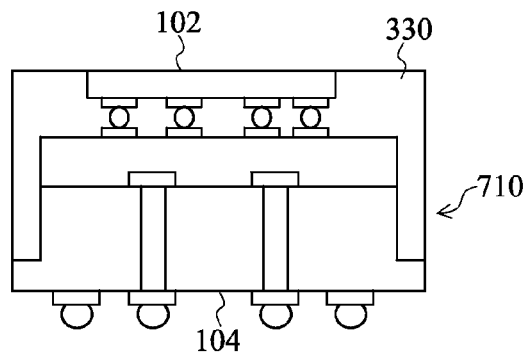

FIGS. 13 and 14 illustrate cross-sectional views of various intermediate stages in a fabrication of a semiconductor device in accordance with some embodiments. The various elements referred to in FIGS. 13 and 14 refer to the same or similar elements as discussed above, wherein like reference numerals refer to like elements.

Referring first to FIG. 13, there is shown a structure after performing a back thinning process such as that discussed above in FIG. 4A, wherein the backside thinning process is performed partially toward the recesses 220. In particular, FIG. 13 assumes processes such as those discussed above with reference to FIGS. 1-3 or FIGS. 8-10 have been performed, followed by a back thinning process such as that discussed above with reference to FIG. 4.

In embodiments such as these, the backside thinning process of the second substrates 104 is performed such that the molding compound 330 is not exposed. In some embodiments, a thickness $T_1$ of the second substrates 330 remains after the backside thinning process.

Thereafter, processing such as that discussed above with reference to FIGS. 5-7 may be performed to singulate, form electrical connections (e.g., electrical connections 550) to form separate packages. The singulation process in this embodiment involves singulating (e.g., sawing) through a portion of the second substrate 104 as well as the molding compound 330, whereas the singulation process described above with reference to FIG. 7 is performed through the molding compound 330 because the recesses 220, and hence the molding compound 330, extends completely through the second substrates 104 after the back thinning process.

For example, FIG. 14 illustrates a resulting structure after performing processes such as those discussed above with reference to FIGS. 5-7 on the structure illustrated in FIG. 13 in accordance with some embodiments. As illustrated in FIG. 14, after singulation, a portion of the second substrate 104 remains along a bottom surface.

Figure 15A:
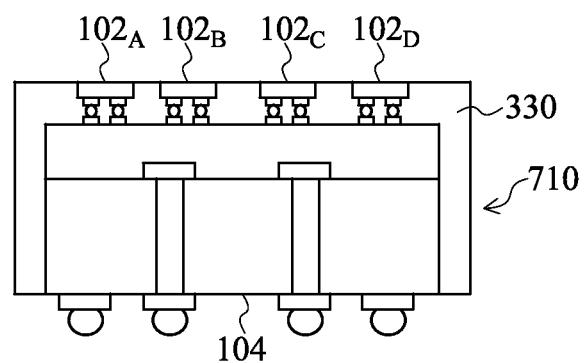
FIGS. 15A-18B illustrate various embodiments having multiple substrates mounted on another substrate in accordance with some embodiments.
Figure 15B:
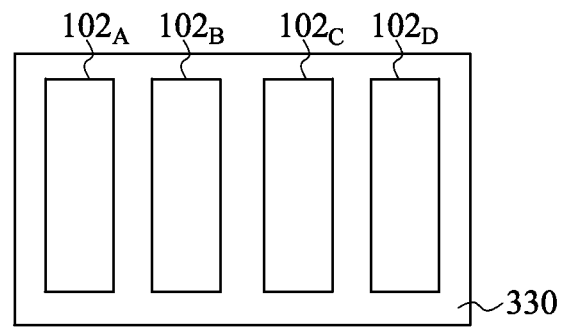

FIGS. 15A and 15B illustrate multi-die packages in accordance with some embodiments. Whereas embodiments such as those discussed above illustrate embodiments in which a single first substrate 102 is included in each package (e.g., as illustrated in FIGS. 7 and 11, other embodiments may have multiple first substrates mounted on a single second substrate 104. For example, FIGS. 15A and 15B illustrate a cross-sectional view and a plan view, respectively, of first substrates 102A-102D mounted on a single second substrate 104. In particular, FIGS. 15A and 15B illustrate a structure that may be formed using processes such as those described above with reference to FIGS. 1-9 having multiple first dies 102. As illustrated in FIGS. 15A and 15B, a single molding compound layer 330 extends along sidewalls of the first substrates 102A-102D and the second substrate 104.

Figure 16A:
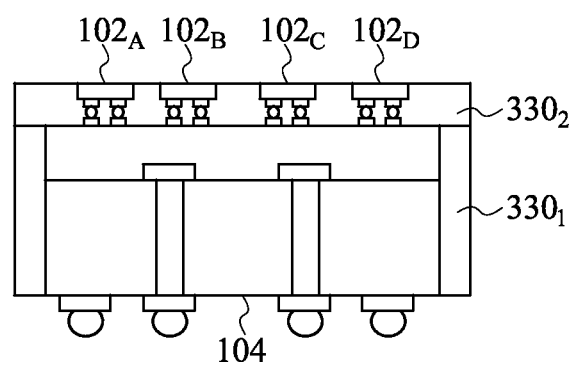
Figure 16B:
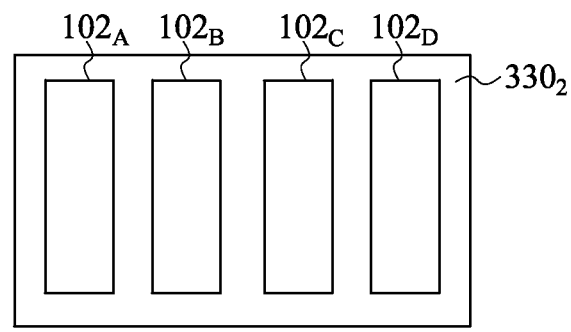

FIGS. 16A and 16B illustrate a cross-sectional view and a plan view, respectively, of first substrates 102A-102D mounted on a single second substrate 104 using a process such as that discussed above with reference to FIGS. 10-11. As illustrated in FIGS. 16A and 16B, two molding compound layers, e.g., the first molding compound layer $330_1$ and the second molding compound layer $330_2$, collectively referred to as molding compound layer 330, are utilized as discussed above with reference to FIGS. 10 and 11.

Figure 17A:
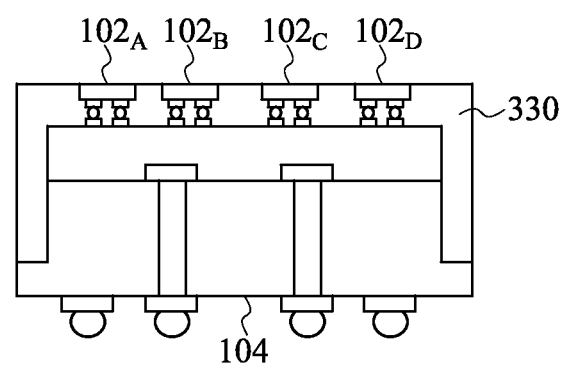
Figure 17B:
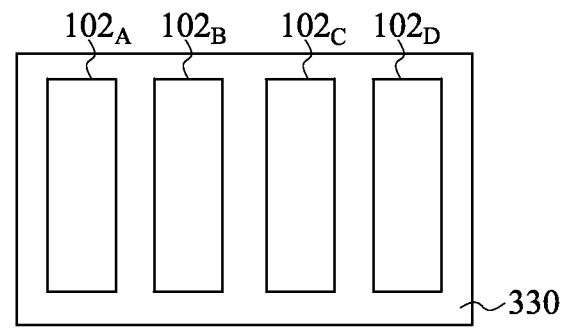

FIGS. 17A and 17B illustrate a cross-sectional view and a plan view, respectively, of first substrates 102A-102D mounted on a single second substrate 104 using a process such as that discussed above with reference to FIGS. 13 and 14. As illustrated in FIGS. 17A and 17B, a portion of the second substrate 104 may remain along the sidewalls of the completed package as described above with reference to FIGS. 13 and 14.

Figure 18A:
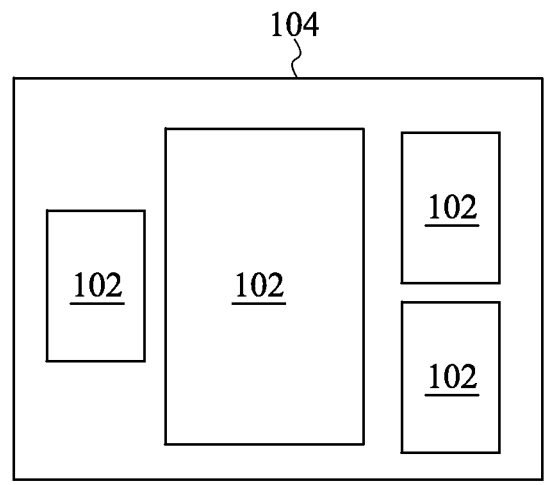
Figure 18B:
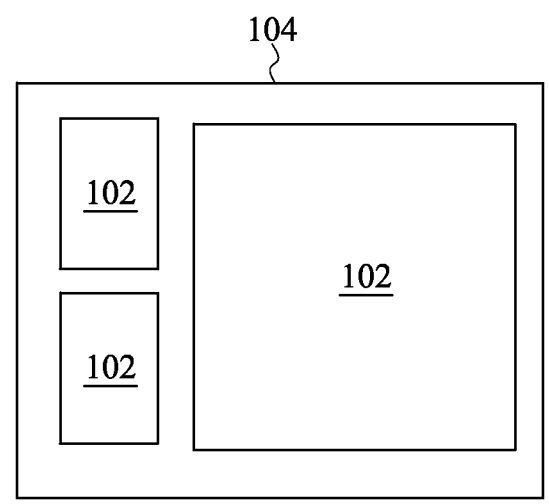

FIGS. 15A-17B illustrate four similarly shaped and sized first dies 102A-102D mounted on a single second substrate 104 for illustrative purposes. In other embodiments, a different number of first substrates 102 may be used, and the second substrates 102 may be of varying sizes. For example, FIGS. 18A and 18B illustrate plan views of other embodiments having varying sizes and numbers of first substrates 102. Other embodiments may utilize other configurations. two molding compound layers, e.g., the first molding compound layer $330_1$ and the second molding compound layer $330_2$, collectively referred to as molding compound layer 330, are utilized as discussed above with reference to FIGS. 10 and 11.

Figure 19:
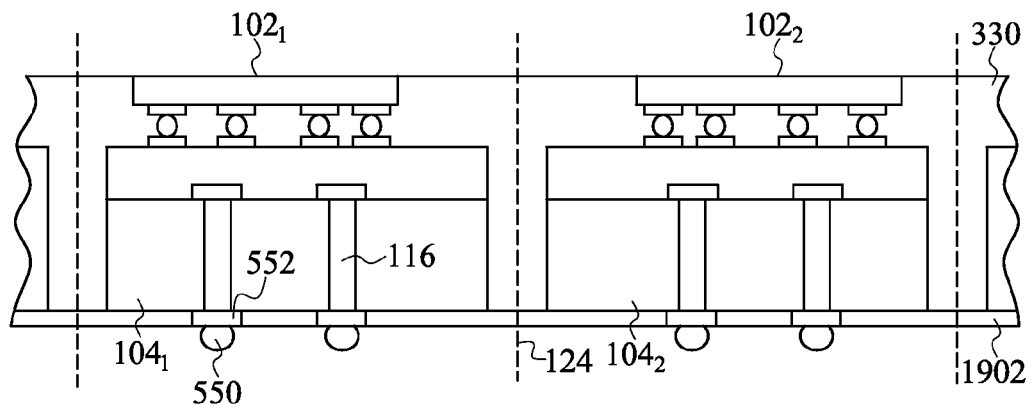
FIGS. 19 and 20 illustrate various intermediate stages of forming a semiconductor device in accordance with some embodiments.
Figure 20:
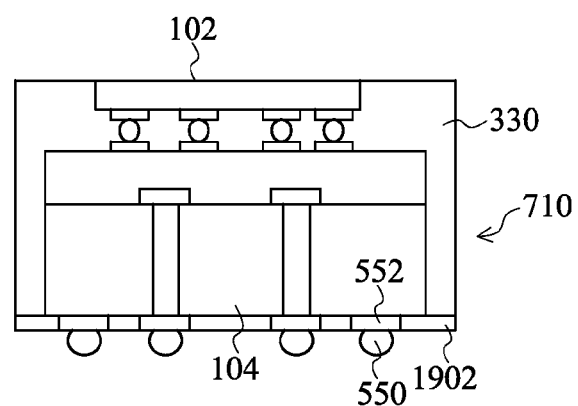

FIGS. 19-20 illustrate a structure having a passivation layer formed along a backside of the second substrate 104 in accordance with some embodiments. Referring first to FIG. 19, there is shown a structure such as that illustrated in FIG. 4A after forming a passivation layer 1902 along backside of the second substrate 104 after the thinning process. The structure illustrated in FIG. 19 is similar to that structure illustrated in FIG. 5 with the passivation layer 1902 added to provide additional protection, wherein like reference numerals refer to like elements. FIG. 19 also illustrates formation of the contact pads 552 and electrical connections 550 as discussed above.

In some embodiments, the passivation layer 1902 may comprise one or more layers organic or inorganic materials. For example, the passivation layer 1902 may be formed of one or more layers of silicon dioxide, undoped silicon glass (USG), silicon nitride (SiN), silicon oxynitride (SiON), phosphosilicate glass (PSG), polybenzoxazole (PBO), benzocyclobutene (BCB), a polymer such as polyimide, compounds thereof, composites thereof, combinations thereof, or the like, deposited by any suitable method, such as spin-on, CVD, PECVD, and the like. As illustrated in FIG. 19, the passivation layer 1902 extends over the second substrate 104 and the exposed molding compound 330.

FIG. 20 illustrates a package after a performing a singulation process. As illustrated, the passivation layer 1902 extends over the molding compound 330 along the edges of the package.

It should be noted that in the various embodiments discussed above that additional or different structures may be present, and that different materials and/or processes may be used. For example, different under-bump metallization (UBM) structures may be used, different passivation structures may be used, and the like.

Figure 21:
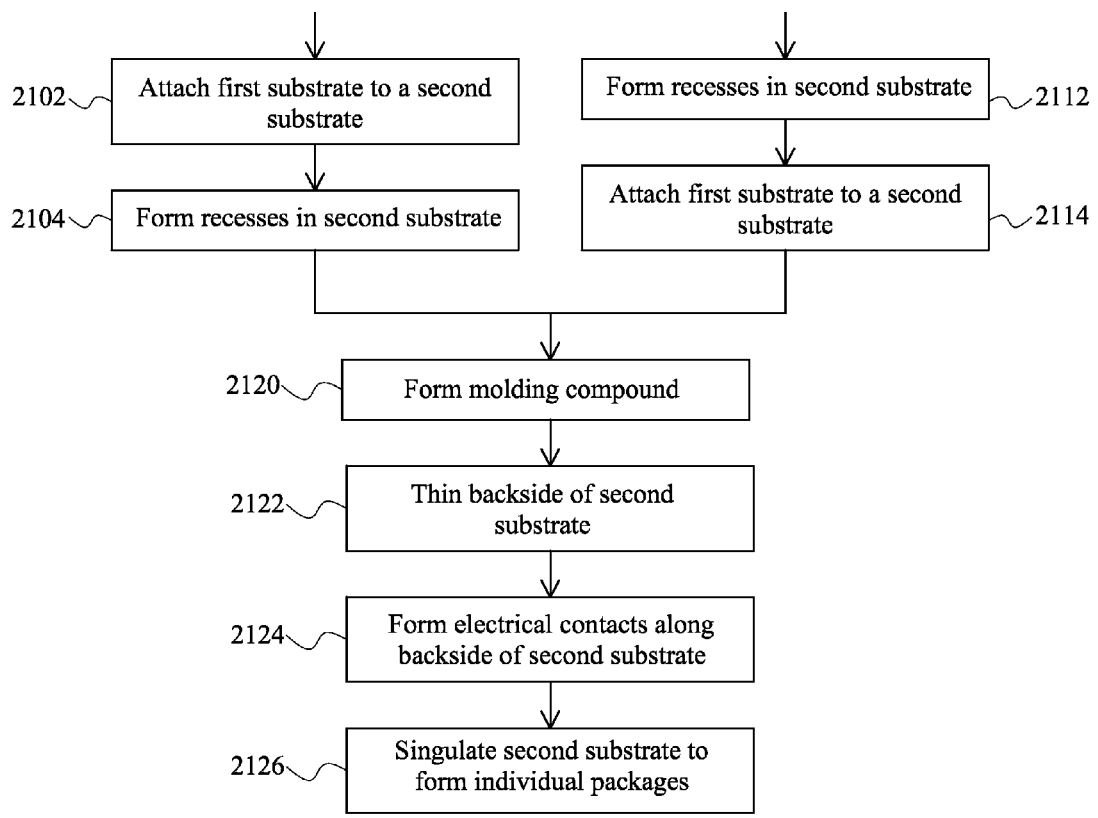
FIG. 21 is a flow chart illustrating method of forming a semiconductor package in accordance with some embodiments.

FIG. 21 is a flow diagram of a method to form a semiconductor package in accordance with some embodiments. The process begins in either step 2102 or step 2112. In step 2102 one or more first substrates are placed on a second substrate, and then in step 2104, the second substrate is recessed between the regions at which the first substrates attach to the second substrate, similar to that discussed above with reference to FIGS. 1 and 2.

Alternatively, the process may begin in step 2112, wherein the second substrate is recessed first, and then in step 2114, one or more first substrates are placed on the second substrate between adjacent recesses, similar to that discussed above with reference to FIGS. 8 and 9.

The recesses in the second substrate may be along the scribe lines between adjacent dies, similar to that illustrated in FIG. 4B, and may extend along a periphery of the wafer, similar to that illustrated in FIG. 12.

Thereafter, in step 2120 one or more layers of a molding compound is placed in the recesses of the second substrate and between adjacent ones of the first substrate. The molding compound may be a single layer, such as that illustrated in FIG. 3, or multiple layers, such as two layers as illustrated in FIG. 10.

In step 2122, a backside of the second wafer is thinned, similar to that illustrated in FIG. 4A. In some embodiments, the molding compound in the recesses is exposed by the thinning process, similar to that illustrated in FIGS. 4A, 4B, and 12.

Electrical contacts may be formed along the backside of the second substrate in step 2124, similar to that discussed above with reference to FIG. 5, and the structure may be singulated in step 2126, similar to that discussed above with reference to FIGS. 6 and 7. In some embodiments, the singulation process is only through the molding compound, leaving the one or more layers of molding compound along sidewalls of the second substrate and the first substrates, similar to that discussed above with reference to FIGS. 7 and 11.

In an embodiment, a method of forming a semiconductor device is provided. The method includes providing a first die and a second die mounted on a first side of a substrate. The substrate has a recess between the first die and the second die. The method further includes forming one or more molding compound layers in the recess such that at least one of the molding compound layers extends along sidewalls of the first die and the second die. The substrate is singulated in the recess to form a singulated structure. In some embodiments, The singulation process is performed by sawing through the molding compound layer in the recess such that the molding compound layer remains along sidewalls of the substrate.

In another embodiment, a method of forming a semiconductor device is provided. The method includes providing a substrate, wherein the a first side of the substrate has a first die region and a second die region. A first die is placed on the first die region of the substrate and a second die is placed on the second die region of the substrate. A recess is formed in the substrate between first die region and the second die region, and one or more molding compound layers is formed in the recess and between the first die and the second die.

In yet another embodiment, a semiconductor structure is provided. The semiconductor structure includes a first substrate and a second substrate mounted to the first substrate. A first molding compound layer is positioned alongside the first substrate, and a second molding compound layer is positioned alongside the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   providing a first die and a second die mounted on a first side of a substrate, wherein the substrate has a recess between the first die and the second die, wherein the substrate comprises a plurality of through vias, the plurality of through vias not being exposed on a second side of the substrate, and wherein the plurality of through vias extends further into the substrate than the recess;
   forming one or more molding compound layers in the recess, at least one of the molding compound layers extends along sidewalls of the first die and the second die;
   thinning the substrate, the thinning exposing the plurality of through vias; and
   after the thinning, singulating the substrate in the recess to form a singulated structure.

2. The method of claim 1, wherein the thinning exposes at least a portion of the molding compound layers in the recess.

3. The method of claim 1, wherein the singulating is performed such that at least a portion of the molding compound layers remains on sidewalls of the substrate after the singulating.

4. The method of claim 1, wherein the substrate comprises a processed wafer, and wherein the singulating results in a stacked die package.

5. The method of claim 1, wherein the providing comprises:
   placing the first die and the second die on the substrate; and
   after the placing, recessing the substrate between the first die and the second die, thereby forming the recess.

6. The method of claim 1, wherein the providing comprises:
   providing the substrate;
   recessing the substrate, thereby forming the recess; and
   after the recessing, placing the first die and the second die on the substrate on opposing sides of the recess.

7. The method of claim 1, wherein the forming the one or more molding compound layers comprises:
   filling the recess with a first molding compound layer; and
   forming a second molding compound layer over the first molding compound layer.

8. The method of claim 7, further comprising planarizing the second molding compound layer such that an upper surface of the first die is exposed.

9. A method of forming a semiconductor device, the method comprising:
   placing a first die and a second die on a first side of a substrate, the first die being attached to a first die region of the substrate, the second die being attached to a second die region of the substrate;
   forming a recess in the substrate on the first side between first die region and the second die region;
   forming one or more molding compound layers in the recess and between the first die and the second die; and
   thinning a second side of the substrate to expose a through via while not exposing the one or more molding compound layers, the through via providing an electrical connection to circuitry on the first side of the substrate.

10. The method of claim 9, wherein the forming the recess in the substrate is performed prior to the placing the first die and the second die on the substrate.

11. The method of claim 9, wherein the forming the recess in the substrate is performed after the placing the first die and the second die on the substrate.

12. The method of claim 9, further comprising planarizing an uppermost surface of the molding compound layers with an upper surface of the first die.

13. The method of claim 9, wherein the recess extends along a periphery of the substrate, and the forming the one or more molding compound layers comprises forming the one or more molding compound layers along the periphery of the substrate.

14. The method of claim 9, further comprising singulating the substrate, thereby forming a singulated structure, at least a portion of the molding compound layers completely covering sidewalls of the substrate.

15. A semiconductor structure comprising:
   a first substrate comprising:
      a first surface at a first side of the first substrate;
      a second surface at the first side of the first substrate, the second surface being lower than the first surface; and
      a third surface opposing the first surface and the second surface;
   a second substrate mounted to the first surface of the first substrate;
   a first molding compound layer comprising a first portion along a sidewall of the first substrate, wherein the first portion of the first molding compound layer extends over the second surface of the first substrate; and
   a second molding compound layer along a sidewall of the second substrate.

16. The semiconductor structure of claim 15, wherein the first substrate comprises a plurality of through vias extending to a backside of the first substrate.

17. The semiconductor structure of claim 15, wherein the first molding compound layer extends to the first side of the first substrate.

18. The semiconductor structure of claim 15, wherein an upper surface of the second substrate is exposed through the second molding compound layer.

19. The semiconductor structure of claim 15, wherein the first molding compound layer and the second molding compound layer are a same material.

* * * * *